United States Patent
Iwabuchi et al.

(10) Patent No.: US 7,592,683 B2
(45) Date of Patent: Sep. 22, 2009

(54) SEMICONDUCTOR DEVICE WITH IMPROVED ELECTROSTATIC TOLERANCE

(75) Inventors: Akio Iwabuchi, Niiza (JP); Kazuya Aizawa, Niiza (JP)

(73) Assignee: Sanken Electric Co., Ltd., Saitama (JP)

( * ) Notice: Subject to any disclaimer, the term of this patent is extended or adjusted under 35 U.S.C. 154(b) by 444 days.

(21) Appl. No.: 10/566,421

(22) PCT Filed: Feb. 25, 2005

(86) PCT No.: PCT/JP2005/003161
§ 371 (c)(1),
(2), (4) Date: Jan. 30, 2006

(87) PCT Pub. No.: WO2005/093842
PCT Pub. Date: Oct. 6, 2005

(65) Prior Publication Data
US 2006/0255378 A1    Nov. 16, 2006

(30) Foreign Application Priority Data
Mar. 26, 2004    (JP) .............................. 2004-093702

(51) Int. Cl.
*H01L 29/93* (2006.01)
(52) U.S. Cl. ..................................... 257/487
(58) Field of Classification Search ................ 257/487
See application file for complete search history.

(56) References Cited
U.S. PATENT DOCUMENTS

| | | | | |
|---|---|---|---|---|
| 5,306,938 A | * | 4/1994 | Shirai | 257/344 |
| 5,374,843 A | * | 12/1994 | Williams et al. | 257/492 |
| 5,796,146 A | * | 8/1998 | Ludikhuize | 257/343 |
| 5,883,413 A | * | 3/1999 | Ludikhuize | 257/343 |
| 5,932,932 A | | 8/1999 | Agatsuma et al. | |
| 6,064,178 A | | 5/2000 | Miller | |

FOREIGN PATENT DOCUMENTS

WO    WO-98/15047    4/1998

* cited by examiner

*Primary Examiner*—Kenneth A Parker
*Assistant Examiner*—Anthony Ho
(74) *Attorney, Agent, or Firm*—Howard & Howard Attorneys PLLC

(57) ABSTRACT

A semiconductor device comprises a P$^-$-type semiconductor substrate (15), an N$^-$-type semiconductor substrate (21) formed on the P$^-$-type semiconductor substrate (15), an upper P-type semiconductor region (13) formed in the surface region of the N$^-$-type semiconductor substrate (21) and electrically connected to a ground electrode (1), a lower P-type semiconductor region (14) formed beneath the upper P-type semiconductor region (13), a first N$^+$-type semiconductor region (22) electrically connected to a drain electrode (2), a P-type semiconductor region (19) functioning as a channel forming region, a P$^+$-semiconductor region (12) electrically connected to a back gate electrode (5), a second N$^+$-semiconductor region (23) electrically connected to a source electrode (4), and a gate electrode (3) and a gate insulating film (31) both on the P-type semiconductor region (19), and the lower P-type semiconductor region (14) extends toward the first N$^+$-type semiconductor region (22).

5 Claims, 6 Drawing Sheets

SEMICONDUCTOR DEVICE WITH IMPROVED ELECTROSTATIC TOLERANCE

TECHNICAL FIELD

The present invention relates to a semiconductor device, and specifically, relates to a semiconductor device which can improve an electrostatic tolerance.

BACKGROUND ART

In a semiconductor device having a general high withstand voltage horizontal type MOSFET (Metal Oxide Semiconductor Field Effect Transistor), a back gate electrode terminal and an electrode terminal for ground (ground electrode terminal) are electrically short-circuited through, for example, diffusion regions respectively constituting a channel forming region and a ground region, so that the back gate electrode terminal and the ground electrode terminal have the same electric potential (see, for example, Patent Literature 1).

In the above-described technology, however, there may be a case where applying a voltage to the back gate electrode-terminal different from the ground electrode terminal is desired. In such a case, it is necessary to form a back gate region and a ground region electrically isolated from each other. Consequently, there is proposed a semiconductor device having a high withstand voltage horizontal type MOSFET which has a back gate region and a ground region formed electrically isolated from each other (see, for example, Patent Literature 2).

The high withstand voltage horizontal type MOSFET comprises a $P^-$-type semiconductor substrate, an $N^-$-type semiconductor region formed on that substrate by epitaxial growth and functioning as a drain region, an upper P-type semiconductor region and a lower P-type semiconductor region both functioning as a ground region, a P-type semiconductor region which functions as a channel forming region, a first $N^+$ semiconductor region formed in the $N^-$-type semiconductor region and functioning as a drain contact region, a $P^+$-type semiconductor region formed in the P-type semiconductor region and functioning as a back-gate contact region, and a second $N^+$-type semiconductor region formed in the P-type semiconductor region and functioning as a source contact region.

The first $N^+$ semiconductor region which functions as the drain contact region is formed in the surface region of the $N^-$-type semiconductor region which functions as the drain region.

The P-type semiconductor region which functions as the channel forming region is formed in a closed ring shape so as to surround the first $N^+$ semiconductor region.

The upper P-type semiconductor region is formed in a closed ring shape so as to surround the P-type semiconductor region. The lower P-type semiconductor region is so formed as to be adjacent to the bottom surface of the upper P-type semiconductor region.

The upper P-type semiconductor region is electrically connected to a ground electrode.

The $P^+$-type semiconductor region which functions as the back-gate contact region is electrically connected to a back gate electrode.

The first $N^+$ semiconductor region which functions as the drain contact region is electrically connected to a drain electrode.

The second $N^+$ semiconductor region which functions as the source contact region is electrically connected to a source electrode.

A gate electrode is formed on the top surface of the P-type semiconductor region laid out between the second $N^+$ semiconductor region which functions as the source contact region, and an the $N^-$-type semiconductor region, though a gate insulating film Patent Literature 1: Unexamined Japanese Patent Application KOKAI Publication No. 2000-260981

Patent Literature 2: Unexamined Japanese Patent Application KOKAI Publication No. H8-330580

DISCLOSURE OF INVENTION

Problem to Be Solved by the Invention

The above-described high withstand voltage horizontal type MOSFET has, however, a relatively low electrostatic tolerance applied to the drain electrode, and thus there is a problem such that the gate insulating film may break down.

It is believed that the breakdown of the gate insulating film is caused by the mechanism explained below.

As negative static electricity is applied to the drain electrode, in other words, as a relatively high positive electric potential is applied to the ground electrode, a positive electric potential is applied to the gate electrode through a parasitic diode that is formed by the upper P-type semiconductor region which functions as the ground region, and the $N^-$-type semiconductor region which functions as the lower P-type semiconductor region and the drain region.

A positive electric potential is also applied to the back gate electrode through a parasitic diode (parasitic transistor) that is formed by the upper P-type semiconductor region and the lower P-type semiconductor region which function as the ground region, the $N^-$-type semiconductor region which functions as the drain region, the P-type semiconductor region, and the $P^+$-type semiconductor region which functions as the back-gate contact region.

This causes a relatively large current to flow through a path (current path 1) which is formed by the $P^+$-type semiconductor region which functions as the back-gate contact region, the P-type semiconductor region, the $N^+$-type semiconductor region, and the first $N^+$-type semiconductor region, and an electric potential difference is caused in the horizontal direction of the P-type semiconductor region.

A current also flows through a path (current path 2) which is formed by the upper P-type semiconductor region, the lower P-type semiconductor region, the $P^-$-type semiconductor region, the $N^-$-type semiconductor region, and the first $N^+$ semiconductor region, but because the resistance in the horizontal direction of the $P^-$-type semiconductor substrate is large, the current which flows through the current path 2 is smaller than the current which flows through the current path 1.

This results in generation of the electric potential difference between the gate electrode and the P-type semiconductor region beneath that electrode, and if the electric potential exceeds the breakdown electrostatic tolerance of the gate insulating film, this leads to the breakdown of the gate insulting film. That is, it is believed that the gate insulating film is broken due to the larger resistance of the current path 2 than the resistance of the current path 1.

The invention has been made in view of the above-described circumstance, and it is an object of the invention to provide a semiconductor device which can improve an electrostatic tolerance.

Moreover, it is an object of the invention to provide a semiconductor device which can suppress the breakdown of a gate insulating film.

Means for Solving the Problem

To achieve the object, a semiconductor device according to the first aspect of the invention comprises:

a first semiconductor region of a first conductive type;

a second semiconductor region of a second conductive type formed on the first semiconductor region;

a third semiconductor region of the first conductive type formed in a surface region of the second semiconductor region along an outer periphery of the second semiconductor region, and having a higher impurity concentration than that of the first semiconductor region;

a fourth semiconductor region of the first conductive type formed adjacent to a bottom surface of the third semiconductor region, and having a higher impurity concentration than that of the first semiconductor region;

a fifth semiconductor region of the first conductive type formed in the surface region of the second semiconductor region;

a sixth semiconductor region of the second conductive type formed in a surface region of the fifth semiconductor region;

a first electrode electrically connected to the second semiconductor region;

a second electrode electrically connected to the sixth semiconductor region; and a control electrode laid out on the fifth semiconductor region through an insulating film, wherein the fourth semiconductor region is formed in the first semiconductor region and the second semiconductor region, and is so formed as to extend closer to the fifth semiconductor region than the third semiconductor region.

The fourth semiconductor region may be formed in such a way that an electric potential difference between the control electrode and the fifth semiconductor region lying under the control electrode becomes small with negative static electricity being applied to the first electrode.

The fourth semiconductor region may face the fifth semiconductor region through the second semiconductor region.

The fourth semiconductor region may be so formed as to extend closer to the first electrode than the fifth semiconductor region.

The semiconductor device may further comprise a seventh semiconductor region of the second conductive type having a higher impurity concentration than that of the second semiconductor region, in the surface region of the second semiconductor region, and the seventh semiconductor region may be electrically connected to the first electrode.

The fifth semiconductor region may be formed in a closed ring shape so as to surround the seventh semiconductor region, and the third semiconductor region may be formed in a closed ring shape so as to surround the fifth semiconductor region.

The semiconductor device may further comprise an eighth semiconductor region of the first conductive type formed in the surface region of the fifth semiconductor region and having a higher impurity concentration than that of the fifth semiconductor region, and the eighth semiconductor region may be electrically connected to a back gate electrode.

To achieve the object the semiconductor device according to the second aspect comprises:

a first semiconductor region of a first conductive type;

a second semiconductor region of a second conductive type formed on the first semiconductor region;

a third semiconductor region of the first conductive type formed in a surface region of the second semiconductor region along an outer periphery of the second semiconductor region, and having a higher impurity concentration than that of the first semiconductor region;

a fourth semiconductor region of the first conductive type formed adjacent to a bottom surface of the third semiconductor region, and having a higher impurity concentration than that of the first semiconductor region;

a fifth semiconductor region of the first conductive type formed in the surface region of the second semiconductor region;

a sixth semiconductor region of the second conductive type formed in a surface region of the fifth semiconductor region;

a first electrode electrically connected to the second semiconductor region;

a second electrode electrically connected to the sixth semiconductor region; and a control electrode laid out on the fifth semiconductor region through an insulating film, wherein the fourth semiconductor region is formed in the first semiconductor region and the second semiconductor region, and has a protrusive piece so formed as to extend closer to the first electrode side than the third semiconductor region, and a portion so formed as not to extend closer to the first electrode than the protrusive piece.

The protrusive piece of the fourth semiconductor region may be formed in such a way that an electric potential difference between the control electrode and the fifth semiconductor region lying under the control electrode becomes small with negative static electricity being applied to the first electrode.

A top surface of the protrusive piece of the fourth semiconductor region may face a bottom surface of the fifth semiconductor region through the second semiconductor region.

The semiconductor device may further comprise a seventh semiconductor region of the second conductive type having a higher impurity concentration than that of the second semiconductor region, in the surface region of the second semiconductor region, and the seventh semiconductor region may be electrically connected to the first electrode.

The semiconductor device may further comprise an eighth semiconductor region of the first conductive type formed in the surface region of the fifth semiconductor region and having a higher impurity concentration than that of the fifth semiconductor region, and the eighth semiconductor region may be electrically connected to a back gate electrode.

The fifth semiconductor region may have regions including the sixth semiconductor region and the eighth semiconductor region, and regions not including the sixth semiconductor region and the eighth semiconductor region, and both regions are formed as to be alternately and apart from each other.

The protrusive piece of the fourth semiconductor region may be formed beneath the region of the fifth semiconductor region not including the sixth semiconductor region and the eighth semiconductor region.

The protrusive piece of the fourth semiconductor region may be so formed as to extend closer to the first electrode than the fifth semiconductor region.

The protrusive piece of the fourth semiconductor region may be not formed beneath the region of the fifth semiconductor region including the sixth semiconductor region and the eighth semiconductor region.

The regions of the fifth semiconductor region, which include the sixth semiconductor region and the eighth region, and the regions of the fifth semiconductor region which do not include the sixth semiconductor region and the eighth semiconductor region are laid out in the fifth semiconductor region alternately and apart from each other so as to surround the seventh semiconductor region, and the third semiconductor region may be formed in a closed ring shape so as to surround the fifth semiconductor region.

The semiconductor device may further comprise a high-voltage resistive element.

Effect of the Invention

The invention can improve an electrostatic tolerance.

Figure 1:
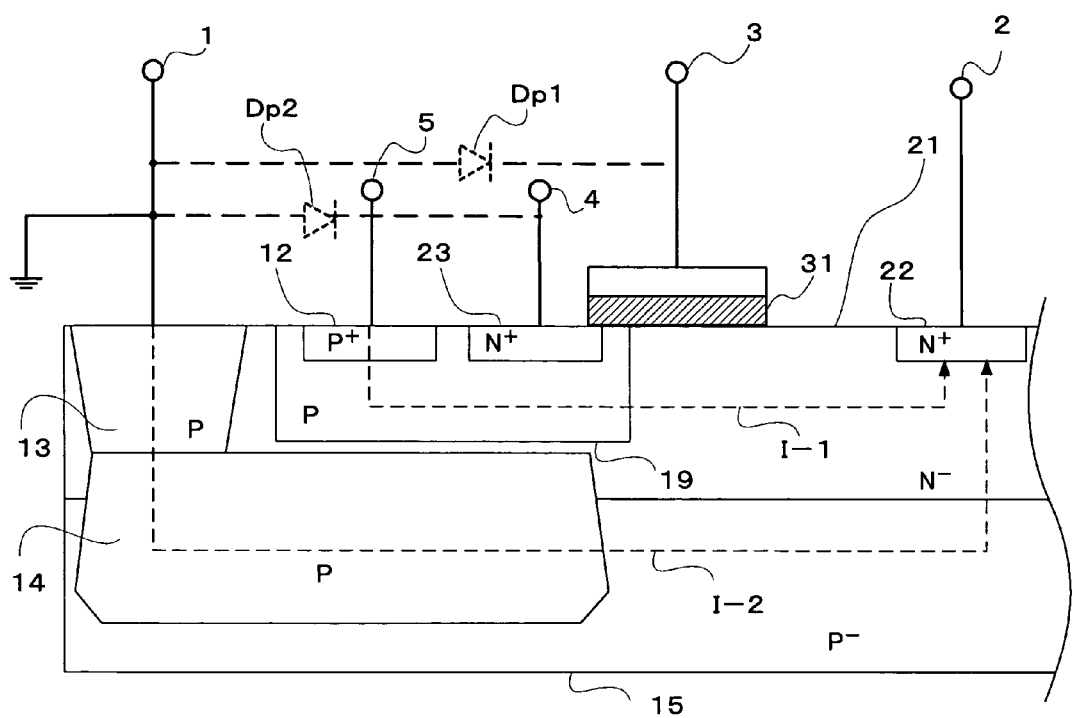
[FIG. 1] A cross-sectional view of a semiconductor device according to a first embodiment
[FIG. 2] A plan view of the semiconductor device according to the first embodiment
[FIG. 3] A plan view of a semiconductor device according to a second embodiment.

EXPLANATION OF REFERENCE NUMERALS 1 ground electrode
2 drain electrode
3 gate electrode
4 source electrode
5 back-gate electrode
12 $P^+$-type semiconductor region
13 upper P-type semiconductor region
14 lower P-type semiconductor region
$14_a$ protrusive piece
15 $P^-$-type semiconductor region
19 P-type semiconductor region
19$a$ P-type semiconductor region
19$b$ P-type semiconductor region
21 $N^-$-type semiconductor region
22 first $N^+$-type semiconductor region
23 second $N^+$-type semiconductor region
31 gate insulating film

BEST MODE FOR CARRYING OUT THE INVENTION conductor devices according to the embodiments of the invention will be explained below. The explanation of the embodiments will be given of a case of a semiconductor device including a high withstand voltage horizontal type MOSFET (Metal Oxide Semiconductor Field Effect Transistor) as an example of the semiconductor device, with reference to the drawings.

First Embodiment

Figure 2:
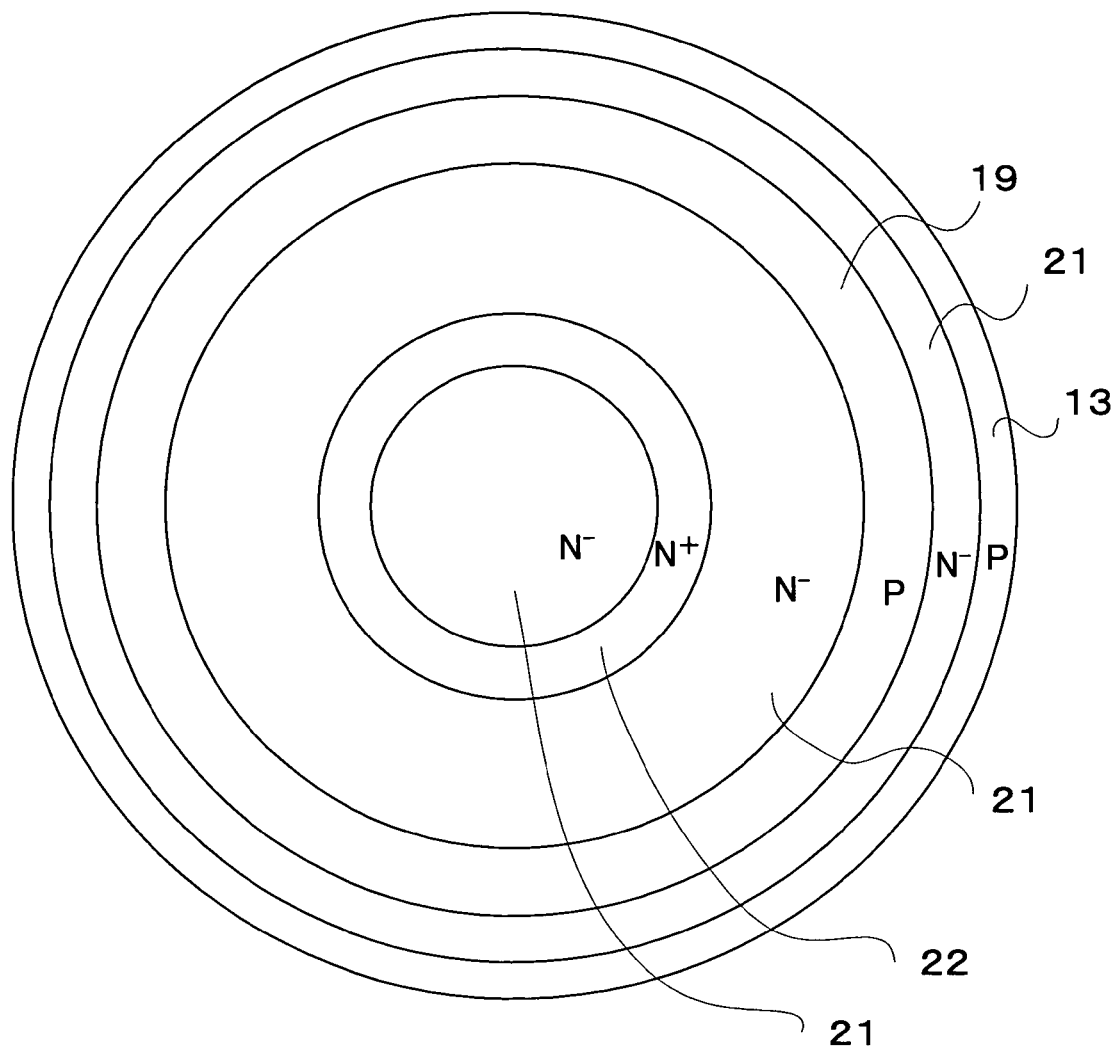

FIG. 1 and FIG. 2 are diagrams illustrating a semiconductor device including a high withstand voltage horizontal type MOSFET according to the first embodiment of the invention. A large number of semiconductor elements, which are formed on the semiconductor device, are omitted in FIG. 1 and FIG. 2.

As illustrated in FIG. 1 and FIG. 2, the semiconductor device of the embodiment comprises a $P^-$-type semiconductor substrate 15, an $N^-$-type semiconductor region 21, a first $N^+$ type semiconductor region 22, a P-type semiconductor region 19, a p-type semiconductor region 12, a second $N^+$-type semiconductor region 23, an upper P-type semiconductor region 13, and a lower P-type semiconductor region 14.

The $P^-$-type semiconductor substrate 15 comprises a first conductive type, for example, a P-type silicon semiconductor substrate formed by diffusing a P-type dopant, such as boron (B), or gallium (Ga). The $P^-$-type semiconductor substrate 15 is not limited to silicon, and boron or the like may be diffused in gallium or the like.

The $N^-$-type semiconductor region 21 is formed on the surface of the $P^-$-type semiconductor substrate 15 by, for example, epitaxial growth. The $N^-$-type semiconductor region 21 comprises a second conductive type, for example, an N-type silicon semiconductor region containing an N-type dopant, such as phosphorous (P), or arsenic (As). The $N^-$-type semiconductor region 21 is not limited to silicon, and may be comprised of a chemical compound like gallium-arsenide. The $N^-$-type semiconductor region 21 functions as a drain region.

As illustrated in FIG. 2, the first $N^+$-type semiconductor region 22 is formed in a closed ring shape in the surface region of the $N^-$-type semiconductor region 21 which functions as the drain region. The first $N^+$-type semiconductor region 22 may be formed in the surface region of the $N^-$-type semiconductor region 21 of the shape of an island (island shape) whose planar shape is circular.

The first $N^+$-type semiconductor region 22 comprises an N-type semiconductor region containing an N-type dopant, such as phosphorous (P), or arsenic (As), and has a higher N-type impurity concentration than that of the $N^-$-type semiconductor region 21. A drain electrode 2 is electrically connected to the first $N^+$-type semiconductor region 22, and which functions as a drain contact region.

The P-type semiconductor region 19 is formed in the surface region of the $N^-$-type semiconductor region 21, and formed in a closed ring shape in such a manner as to surround the first $N^+$-type semiconductor region 22. The P-type semiconductor region 19 comprises a P-type semiconductor formed by diffusing a P-type dopant, such as boron (B), or gallium (Ga). The P-type semiconductor region 19 has a higher P-type impurity concentration than that of the $P^-$-type semiconductor substrate 15. The P-type semiconductor region 19 functions as a channel forming region.

The $P^+$-type semiconductor region 12 is formed in the surface region of the P-type semiconductor region 19. The $P^+$-type semiconductor region 12 comprises a P-type semiconductor formed by diffusing a P-type dopant such as boron (B), or gallium (Ga), and has a higher P-type impurity concentration than that of the P-type semiconductor region 19 or the like. A back gate electrode 5 is electrically connected to the $P^+$-type semiconductor region 12 which functions as a back-gate contact region.

The second $N^+$-type semiconductor region 23 is formed in the surface region of the P-type semiconductor region 19. The second $N^+$-type semiconductor region 23 comprises an N-type semiconductor containing an N-type dopant, such as phosphorous (P), or arsenic (As), and has a higher N-type impurity concentration than that of the $N^-$-type semiconductor region 21. A source electrode 4 is electrically connected to the second $N^+$-type semiconductor region 23 which functions as a source contact region.

A gate electrode 3 is formed on the top surface of the annular P-type semiconductor region 19 laid out between the second N⁺-type semiconductor region 23 which functions as the source contact region and the N⁻-type semiconductor region 21, through a gate insulating film 31 which comprises, for example, a silicon oxide film, or a silicon nitride oxide. As a voltage greater than or equal to the threshold voltage is applied to the gate electrode 3, a channel is formed.

The upper P-type semiconductor region 13 is so formed as to surround the P-type semiconductor region 19. The upper P-type semiconductor region 13 is formed in the surface region of the N⁻-type semiconductor region 21 (P⁻-type semiconductor substrate 15), and comprises a P-type semiconductor formed by diffusing a P-type dopant, such as boron (B), or gallium (Ga). The upper P-type semiconductor region 13 has a higher P-type impurity concentration than that of the P⁻-type semiconductor substrate 15. A ground electrode 1 is electrically connected to the upper P-type semiconductor region 13 which functions as a ground region.

The lower P-type semiconductor region 14 is formed under the upper P-type semiconductor region 13 so that its top surface contacts the bottom surface of the upper P-type semiconductor region 13. The lower P-type semiconductor region 14 is so formed as to extend closer to the P-type semiconductor region 19 than that of the upper P-type semiconductor region 13. That is, the lower P-type semiconductor region 14 is formed in such a manner as to extend toward the first N⁺-type semiconductor region 22 (P-type semiconductor region 19) from beneath the upper P-type semiconductor region 13. Accordingly, as will be discussed later, the electric potential between the gate electrode 3 and the P-type semiconductor region 19 under the electrode 3 can be reduced with negative static electricity being applied to the drain electrode 2. In this embodiment, the lower P-type semiconductor region 14 is formed in such a manner as to extend from beneath the upper P-type semiconductor region 13 to beneath the P-type semiconductor region 19, and faces the P-type semiconductor region 19 via the N⁻-type semiconductor region 21.

The lower P-type semiconductor region 14 is formed by, for example, burying diffusion. The lower P-type semiconductor region 14 is formed in the P⁻-type semiconductor substrate 15 and the N⁻-type semiconductor region 21 by diffusing a P-type dopant, such as boron (B), or gallium (Ga) in the surface region of the P⁻-type semiconductor region 15 to form a region, and then diffusing the P-type dopant toward the N⁻-type semiconductor region 21 at the time of epitaxial growth of the N⁻-type semiconductor region 21 on the P⁻-type semiconductor region 15. The lower P-type semiconductor region 14 has a higher P-type impurity concentration than that of the P⁻-type semiconductor substrate 15.

In such a semiconductor device, as negative static electricity is applied to the drain electrode 2, in other words, as a positive electric potential is applied to the ground electrode 1, as illustrated in FIG. 1, a positive electric potential is applied to the gate electrode 3 through a parasitic diode Dp1. As illustrated in FIG. 1, the positive electric potential is also applied to the back gate electrode 5 through a parasitic diode Dp2.

Accordingly, currents flow through a current path I-1 which is formed by the P⁺-type semiconductor region 12, the P-type semiconductor region 19, the N⁻-type semiconductor region 21, and the first N⁺-type semiconductor region 22, and a current path I-2 which is formed by the upper P-type semiconductor region 13, the lower P-type semiconductor region 14, the P⁻-type semiconductor substrate 15, the N⁻-type semiconductor region 21, and the first N⁺-type semiconductor region 22.

The lower P-type semiconductor region 14 is so formed as to extend closer to the P-type semiconductor region 19 than that of the upper P-type semiconductor region 13 (in the embodiment, so as to extend to under the P-type semiconductor region 19). The lower P-type semiconductor region 14 has a high P-type impurity concentration in comparison with that of the P⁻-type semiconductor substrate 15, and has a resistance lower than the resistance of the P⁻-type semiconductor substrate 15. Accordingly, the resistance of the current path I-2 is reduced by what corresponds to the extension of the lower P-type semiconductor region 14, and in a case where negative static electricity is applied to the drain electrode 2 (a positive electric potential is applied to the ground electrode 1), the current which flows through the current path I-2 is relatively increased, and contrary, the current which flows through the current path I-1 is relatively reduced. This results in reduction in the electric potential difference between the gate electrode 3 and the P-type semiconductor region 19 thereunder.

As explained above, according to the first embodiment, because the lower P-type semiconductor region 14 is so formed as to extend to under the P-type semiconductor region 19, the resistance of the current path I-2 becomes lower than the resistance of the current path I-1. Accordingly, when negative static electricity is applied to the drain electrode 2, the current which flows through the current path I-1 becomes relatively small and the electric potential difference which occurs between the gate electrode 3 and the P-type semiconductor region 19 lying thereunder becomes small. This can result in good suppression of breakdown of the gate insulating film 31. The electrostatic tolerance to negative static electricity can be improved without changing various characteristics, such as the sizes of other elements, and the electrostatic tolerances.

Second Embodiment

Figure 3:
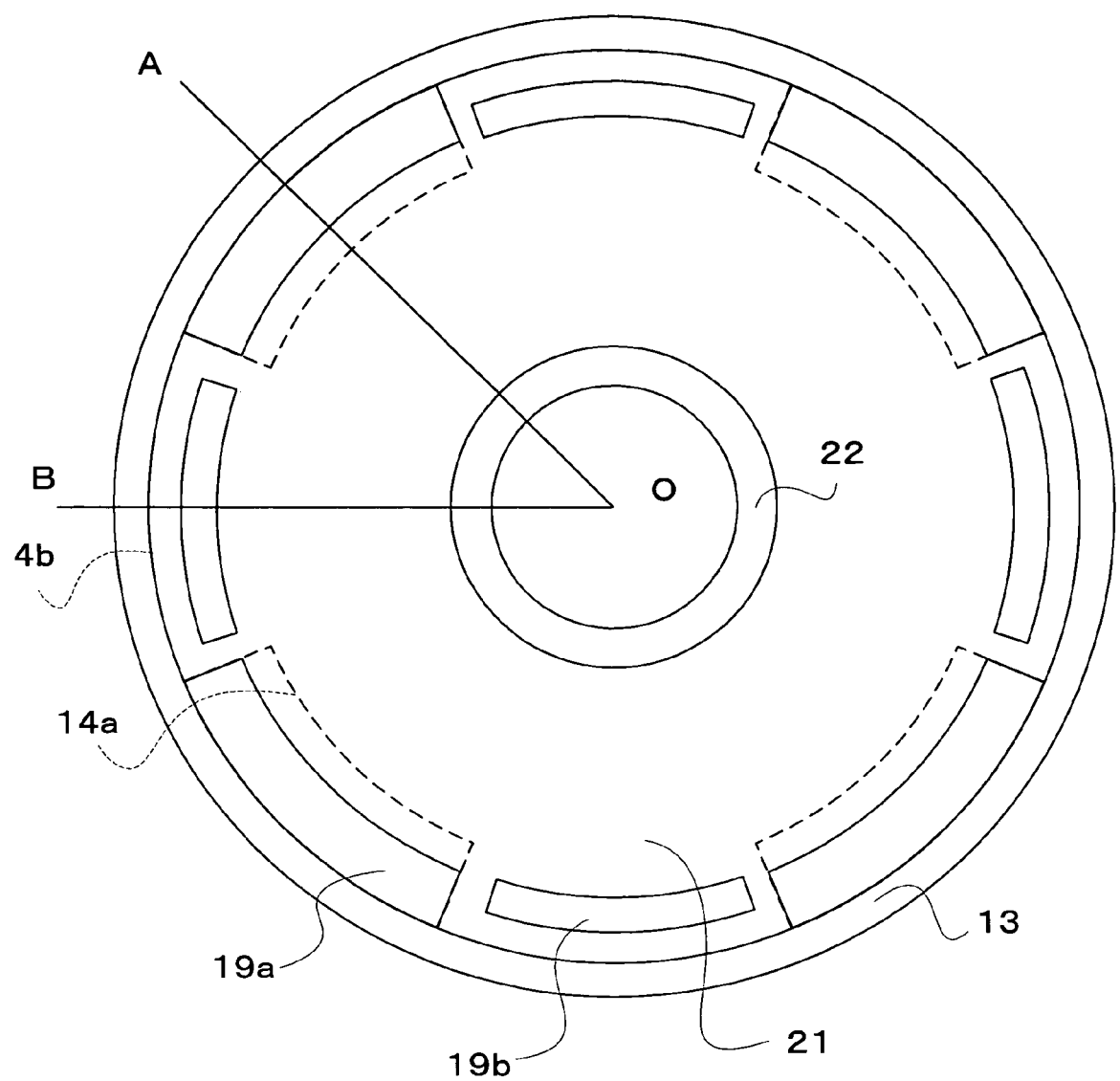
Figure 4:
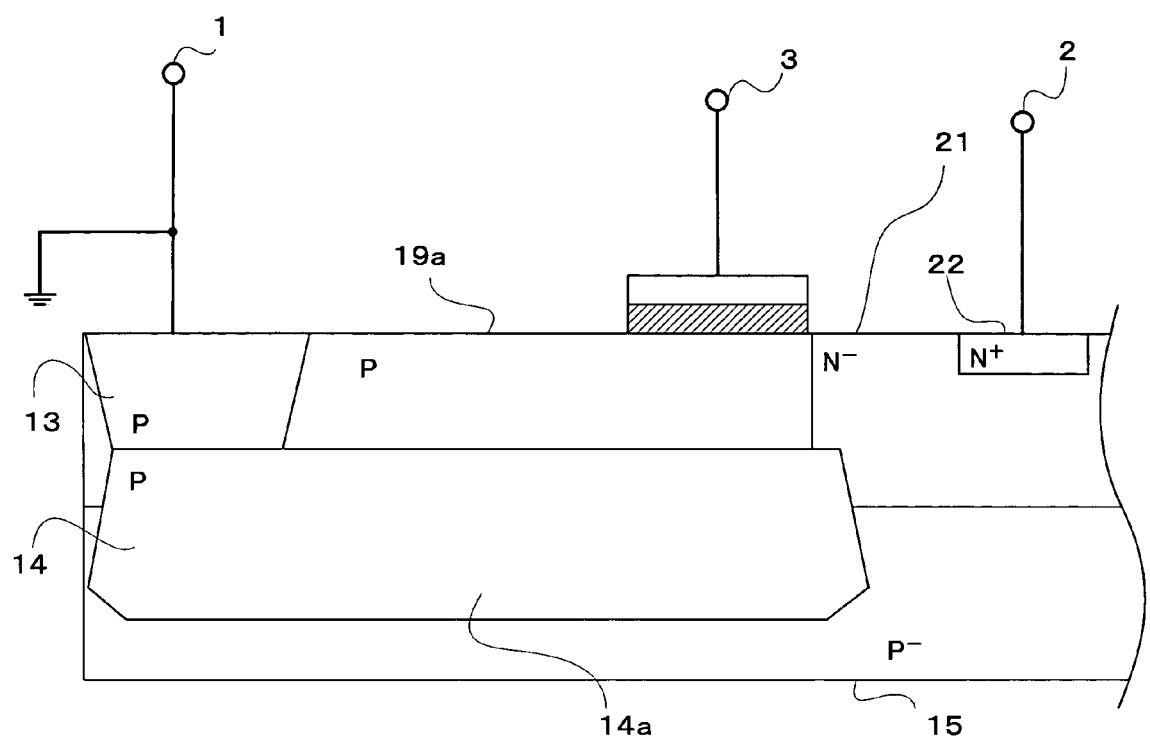
[FIG. 4] AnAO cross-sectional view in FIG. 3.
Figure 5:
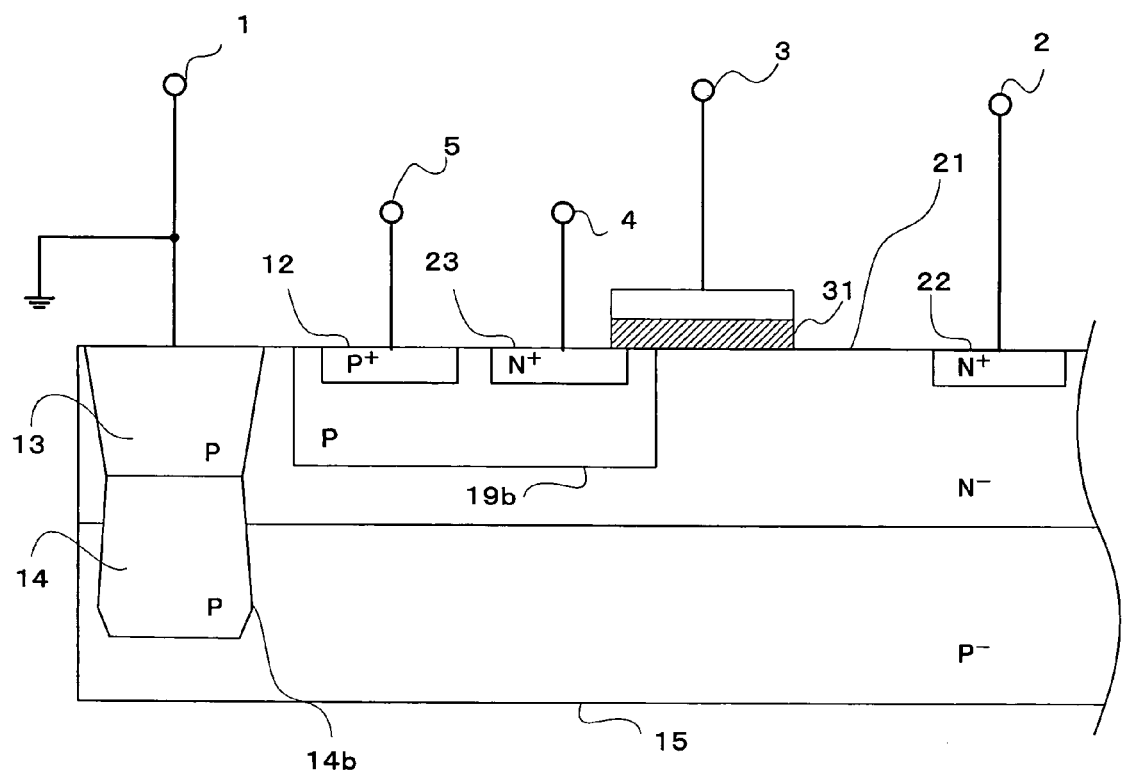
[FIG. 5] A BO cross-sectional view in FIG. 3.

FIG. 3 is a plan view of a semiconductor device having a high withstand voltage horizontal type MOSFET according to the second embodiment of the invention FIG. 4 is an AO cross-sectional view of FIG. 3, and FIG. 5 is a BO cross-sectional view of FIG. 3. In this embodiment, a large number of semiconductor elements which are formed on the semiconductor device as in the first embodiment are omitted in FIG. 3 to FIG. 5.

The differences between the semiconductor device of the embodiment and the semiconductor device of the first embodiment lie in that there are two kinds of P-type semiconductor regions 19, and the shape of the lower P-type semiconductor region 14 differs accordingly. Detailed explanations of the portions which take the same structures as those of the first embodiment will be omitted As illustrated in FIG. 3, in the semiconductor device of the embodiment, the first N⁺-type semiconductor region 22 is formed in a closed ring shape around a point O, and P-type semiconductor regions 19a and P-type semiconductor regions 19b are alternately and intermittently formed in such a manner as to surround the first N⁺-type semiconductor region 22. The lower P-type semiconductor region 14 is formed in a closed ring shape, and has a plurality of protrusive pieces 14a. The upper P-type semiconductor region 13 is formed in a closed ring shape so as to surround the first N⁺-type semiconductor region 22, and the P-type semiconductor regions 19a, 19b. The first N⁺-type semiconductor region 22 may be formed in the surface region of the N⁻-type semiconductor region 21 in the shape of an island (island shape) whose planar shape is circular.

The protrusive pieces 14a of the lower P-type semiconductor region 14 are formed under the P-type semiconductor regions 19a, but not formed under the P-type semiconductor regions 19b. Therefore, the P-type semiconductor regions 19b and the protrusive pieces 14a of the lower P-type semiconductor region 14 are structured so that they are laid out alternately, and as viewed from the above, both do not overlap each other.

As illustrated in FIG. 4, the P-type semiconductor region 19a does not have the $P^+$-type semiconductor region 12 functioning as the back-gate contact region, and the second $N^+$-type semiconductor region 23 functioning as the source contact region in the first embodiment. The side face of the P-type semiconductor region 19a is formed adjacent to the upper P-type semiconductor region 13. Further, the bottom surface of the P-type semiconductor region 19a contacts the top surface of the protrusive piece 14a of the lower P-type semiconductor region 14.

As illustrated in FIG. 5, the P-type semiconductor region 19b, unlike the P-type semiconductor region 19a, has the $P^+$-type semiconductor region 12 which functions as the back-gate contact region, and the second $N^+$-type semiconductor region 23 which functions as the source contact region in the first embodiment, and is so formed as to be apart from the upper P-type semiconductor region 13. The lower P-type semiconductor region 14 is not formed under the P-type semiconductor region 19b unlike the P-type semiconductor region 19a.

The protrusive pieces 14a of the lower P-type semiconductor region 14 are formed in such a manner as to extend closer to the drain electrode 2 (first $N^+$-type semiconductor region 22) than the upper P-type semiconductor region 13. In the embodiment, the end portions of the protrusive pieces 14a extend in such a manner as to protrude more than the extended end portions of the P-type semiconductor regions 19 on the drain electrode 2. A portion 14b of the lower P-type semiconductor region 14 at which no protrusive piece 14a is formed is formed in such a manner as not to extend closer to the drain electrode 2 than the protrusive piece 14a, and is formed in approximately the same way as the upper P-type semiconductor region 13 in the embodiment In such a semiconductor device, because the protrusive pieces 14a of the lower P-type semiconductor region 14 are formed under the P-type semiconductor regions 19a, as for the first embodiment, the resistance of the current path I-2 is reduced by what corresponds to the extension of the protrusive pieces 14a. Accordingly, when negative static electricity is applied to the drain electrode 2 (a positive electric potential is applied to the ground electrode 1), the current which flows through the current path I-2 is relatively increased and contrary, the current which flows through the current path I-1 is relatively decreased. This results in reduction in the electric potential difference between the gate electrode 3 and the P-type semiconductor region 19 thereunder, thus making it possible to prevent breakdown of the gate insulating film 31.

In particular, because the lower P-type semiconductor region 14 can be formed thick in the embodiment, the resistance of the current path I-2 can be made lower.

As explained above, according to the second embodiment, because the protrusive pieces 14a are formed under the P-type semiconductor regions 19a, the resistance of the current path I-2 becomes smaller than the resistance of the current path I-1. Accordingly, when negative static electricity is applied to the drain electrode 2, the current which flows through the current path I-1 becomes relatively small and the electric potential difference which occurs between the gate electrode 3 and the P-type semiconductor region 19 thereunder becomes small. This can result in good suppression of breakdown of the gate insulating film 31. The electrostatic tolerance to negative static electricity can be improved without changing various characteristics such as the sizes of other elements, and the electrostatic tolerances.

According to the embodiment, because the lower P-type semiconductor region 14 can be formed thick, the resistance of the current path I-2 can be made lower, thus further suppressing breakdown of the gate insulating film 31.

Further, according to the embodiment, the lower P-type semiconductor region 14 is not formed under the P-type semiconductor regions 19b, thus facilitating high withstand voltage design or the like.

Third Embodiment

Figure 6:
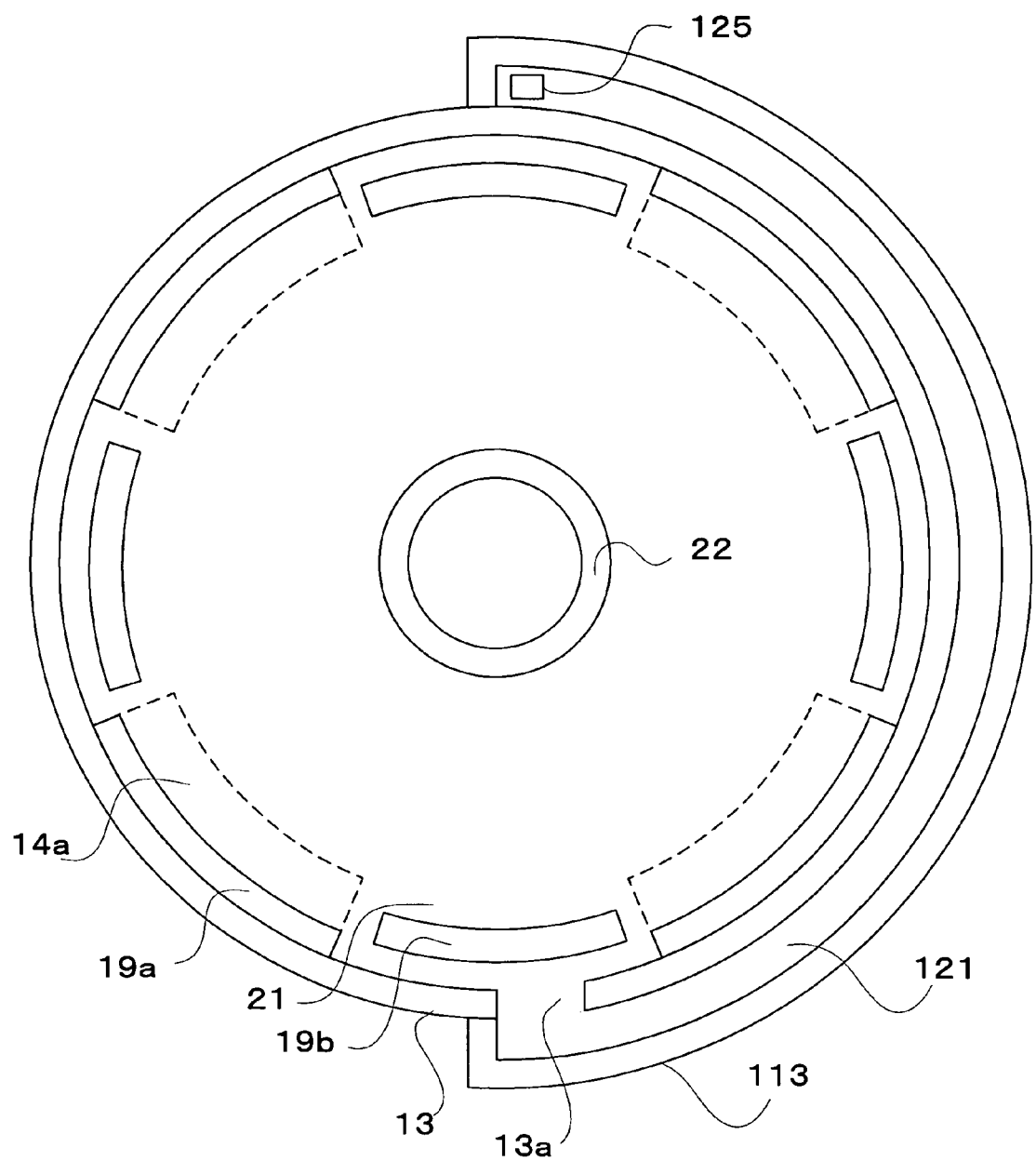
[FIG. 6] A plan view of a semiconductor device according to a third embodiment.

FIG. 6 is a plan view of a semiconductor device having a high withstand voltage horizontal type MOSFET according to the third embodiment A large number of semiconductor elements, which are formed on the semiconductor device in the embodiment, are also omitted in FIG. 6 as per the first embodiment The difference between the semiconductor device of this embodiment and the semiconductor device of the second embodiment lies in that a high-voltage resistive element. Detailed explanations of the portions which take the same structures as those of the second embodiment will be omitted As illustrated in FIG. 6, in the semiconductor device of the embodiment, a part of the upper P-type semiconductor region 13 is provided with a notch portion 13a, though which an $N^-$-type semiconductor region 121 constituting the drain region is formed in a band-like shape on the outer periphery side of the upper P-type semiconductor region 13. An $N^+$-type semiconductor region 125 is formed of the terminal end of the $N^-$-type semiconductor region 121 formed in the band-like shape. The $N^-$-type semiconductor region 121 formed in the band-like shape is surrounded by an upper P-type semiconductor region 113 and functions as a high-voltage resistive element In such a semiconductor device, because the protrusive pieces 14a of the lower P-type semiconductor region 14 are formed under the P-type semiconductor regions 19a, it is possible to prevent breakdown of the gate insulating film 31 as per the second embodiment. The N-type semiconductor region 121 can function as a high-voltage resistive element As explained above, the third embodiment can ensure combination with the high-voltage resistive element, in addition to the effects of the second embodiment The invention is not limited to the structures of the embodiments, and can be modified and adapted in various forms.

For example, while the lower P-type semiconductor region 14 is so formed as to extend to under the P-type semiconductor region 19 in the first embodiment, it has only to be formed in such a way that the resistance of the current path I-2 becomes smaller than the resistance of the current path I-1, and has only to be so formed as to extend closer to the P-type semiconductor region 19 than the upper P-type semiconductor region 13. Accordingly, the electric potential difference between the gate electrode 3 and the P-type semiconductor region 19 thereunder becomes small, thus mating it possible to prevent breakdown of the gate insulating film 31.

To sufficiently reduce the resistance of the current path I-2 in comparison with the resistance of the current path I-1, it is preferable that the end portion of the lower P-type semiconductor region 14 on the first $N^+$-type semiconductor region 22 side (drain electrode 2 side) should be extended closer to the drain electrode 2 than the center of the P-type semiconductor region 19 which functions as the channel forming region. In particular, it is preferable that the end portion of the lower P-type semiconductor region 14 on the drain electrode 2 side should be positioned closer to the drain gate 2 than the end portion of the P-type semiconductor region 19 on the drain electrode side. Accordingly, the electric potential difference between the gate electrode 3 and the P-type semiconductor region 19 thereunder becomes small, thus making it possible to prevent breakdown of the gate insulating film 31. Specifically, it is preferable that the lower P-type semiconductor region 14 should be extended in such a way that its extended end portion protrudes more than the end portion of the P-type semiconductor region 19 on the drain electrode 2 by 2 μm or greater, and desirably, 10 μm or greater.

Although the P-type semiconductor regions 19a are formed above the protrusive pieces 14a of the lower P-type semiconductor region 14 in the second embodiment and the third embodiment, the P-type semiconductor regions 19a may be so structured as not to be formed above the protrusive pieces 14a. The protrusive pieces 14a may be formed under the P-type semiconductor regions 19a through the N⁻-type semiconductor region 21.

While the portion 14b of the lower P-type semiconductor region 14 where no protrusive piece 14a is formed is formed in substantially the same way as the upper P-type semiconductor region 13 in the second embodiment and the third embodiment, it has only to be formed as not to extend closer to the drain electrode 2 than the protrusive piece 14a For example, the portion 14b of the lower P-type semiconductor region 14 where no protrusive piece 14a is formed may be extended so that its end portion is positioned closer to the drain electrode 2 than the center of the P-type semiconductor region 19.

In the embodiments, for example, the N⁻-type semiconductor region 21 is formed by epitaxial growth, and the P-type semiconductor region 19 is formed by diffusing a P-type dopant, but they may be formed by other methods as long as the same resultant object is obtained. While the explanation has been given of the semiconductor substrate as the first semiconductor region is the P⁻-type semiconductor substrate 15 as an example, it may be an N-type semiconductor substrate. In this case, the conductive types of the individual semiconductor regions are inverted.

The present invention is based on Japanese Patent Application No. 2004-93702 filed on Mar. 26, 2004, and includes the specification, the claims, the drawings, and the abstract thereof. The disclosure of the application is hereby entirely incorporated in the present specification by reference.

INDUSTRIAL APPLICABILITY

The invention is useful for a semiconductor device, and, in particular, for a semiconductor device having a high withstand voltage horizontal type MOSFET.

The invention claimed is:
1. A semiconductor device comprising:
a first semiconductor region (15) of a first conductive type;
a second semiconductor region (21) of a second conductive type formed on said first semiconductor region (15);
a third semiconductor region (13) of the first conductive type formed in a surface region of said second semiconductor region (21) along an outer periphery of said second semiconductor region (21), and having a higher impurity concentration than that of said first semiconductor region (15);
a fourth semiconductor region (14) of the first conductive type formed adjacent to a bottom surface of said third semiconductor region (13), and having a higher impurity concentration than that of said first semiconductor region (15);
a fifth semiconductor region (19) of the first conductive type formed in the surface region of said second semiconductor region (21);
a sixth semiconductor region (23) of the second conductive type formed in a surface region of said fifth semiconductor region (19);
a first electrode (2) electrically connected to said second semiconductor region (21);
a second electrode (4) electrically connected to said sixth semiconductor region (23); and
a control electrode (3) laid out on said fifth semiconductor region (19) through an insulating film (31),
an eighth semiconductor region (12) of the first conductive type formed in the surface region of said fifth semiconductor region (19) and having a higher impurity concentration than that of the fifth semiconductor region (19), wherein said fourth semiconductor region (14) is formed in said first semiconductor region (15) and said second semiconductor region (21), and has a protrusive piece (14a) so formed as to extend closer to said first electrode (2) side than said third semiconductor region (13), and a portion (14b) so formed as not to extend closer to said first electrode (2) than said protrusive piece (14a),
said fifth semiconductor region (19) has regions (19b) including said sixth semiconductor region (23) and said eighth semiconductor region (12), and regions (19a) not including said sixth semiconductor region (23) and said eighth semiconductor region (12), and both regions are formed as to be alternately and apart from each other, and
said eighth semiconductor region (12) is electrically connected to a back gate electrode (5).

2. The semiconductor device according to claim 1, wherein the protrusive piece (14a) of said fourth semiconductor region (14) is formed beneath said region (19a) of said fifth semiconductor region (19) not including said sixth semiconductor region (23) and said eighth semiconductor region (12).

3. The semiconductor device according to claim 2, wherein the protrusive piece (14a) of said fourth semiconductor region (14) is so formed as to extend closer to said first electrode (2) than said fifth semiconductor region (19).

4. The semiconductor device according to claim 1, wherein the protrusive piece (14a) of said fourth semiconductor region (14) is not formed beneath said region (19b) of said fifth semiconductor region (19) including said sixth semiconductor region (23) and said eighth semiconductor region (12).

5. The semiconductor device according to claim 1, wherein the regions (19b) of said fifth semiconductor region (19), which include said sixth semiconductor region (23) and said eighth region (12), and the regions (19a) of said fifth semiconductor region (19) which do not include said sixth semiconductor region (23) and said eighth semiconductor region (12) are laid out in said fifth semiconductor region (19) alternately and apart from each other so as to surround said seventh semiconductor region (22), and said third semiconductor region (13) is formed in a closed ring shape so as to surround said fifth semiconductor region (19).

* * * * *

UNITED STATES PATENT AND TRADEMARK OFFICE
CERTIFICATE OF CORRECTION

PATENT NO.       : 7,592,683 B2                                        Page 1 of 1
APPLICATION NO. : 10/566421
DATED            : September 22, 2009
INVENTOR(S)      : Iwabuchi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 679 days.

Signed and Sealed this

Twenty-first Day of September, 2010

David J. Kappos
*Director of the United States Patent and Trademark Office*